(12) United States Patent
Dhar et al.

(10) Patent No.: US 7,112,359 B2
(45) Date of Patent: Sep. 26, 2006

(54) METHOD AND APPARATUS FOR MULTILAYER OPTICAL ARTICLES

(75) Inventors: Lisa Dhar, New Providence, NJ (US); Mark David Michaels, Colorado Springs, CO (US)

(73) Assignee: InPhase Technologies, Inc., Longmont, CO (US)

( * ) Notice: Subject to any disclaimer, the term of this patent is extended or adjusted under 35 U.S.C. 154(b) by 13 days.

(21) Appl. No.: 10/043,939

(22) Filed: Jan. 11, 2002

(65) Prior Publication Data

US 2003/0044577 A1 Mar. 6, 2003

Related U.S. Application Data

(60) Provisional application No. 60/314,320, filed on Aug. 22, 2001.

(51) Int. Cl.
*B32B 3/02* (2006.01)

(52) U.S. Cl. .................. 428/64.4; 428/40.1; 428/41.3; 428/41.7; 428/41.9; 428/42.1; 428/212; 428/913; 428/64.1; 428/65.2; 428/65.6; 428/66.6; 428/221; 359/1; 359/3; 359/6; 359/24; 156/102; 156/99; 369/283; 430/1

(58) Field of Classification Search .................. 359/24, 359/3, 1, 6; 428/64.4, 64.1, 40.1, 41.3, 41.7, 428/41.9, 42.1, 212, 913, 65.2, 65.6, 66.6, 428/221; 369/283; 430/1; 156/102, 99
See application file for complete search history.

(56) References Cited

U.S. PATENT DOCUMENTS

| 3,417,454 A | 12/1968 | Beasley |
| 3,631,411 A | 12/1971 | Kosonocky |
| 3,905,778 A | 9/1975 | Pearson |
| 3,932,148 A | 1/1976 | Krewalk, Sr. |
| 4,183,545 A | 1/1980 | Daly |
| 4,220,491 A | 9/1980 | Metcalf et al. |
| 4,470,856 A | 9/1984 | Little et al. |
| 4,506,184 A | 3/1985 | Siddall |
| 4,537,827 A | 8/1985 | Little et al. |

(Continued)

FOREIGN PATENT DOCUMENTS

EP  0 683 511 B1  11/1995

(Continued)

OTHER PUBLICATIONS

Hesselnik et al., "Optical memories implemented with photorefractive media", Optical and Quantum Electronics 25, 1993, S611-S661.

(Continued)

*Primary Examiner*—Rena Dye
*Assistant Examiner*—Tamra L. Dicus
(74) *Attorney, Agent, or Firm*—Morrison & Foerster LLP

(57) ABSTRACT

The present invention provides a method and apparatus for a multilayer optical articles. A method comprises forming a first multilayer article with a first substrate and a second substrate with a first adherent disposed between the first and second substrate. A first surface of a third substrate is then grasped with a first holder and a second adherent is then disposed on one or more surfaces selected from a second surface of the third substrate and a surface of the first multilayer article while the multilayer article is grasped by a second holder. The second adherent is then at least partially cured while the first and second holders maintain their grasp and while the inner surfaces of the first and second holders are in the selected angular relationship to form a second multilayer article.

22 Claims, 8 Drawing Sheets

U.S. PATENT DOCUMENTS

| | | | |
|---|---|---|---|
| 4,579,616 A | | 4/1986 | Windischmann et al. |
| 4,737,824 A | | 4/1988 | Sakai et al. |
| 4,921,319 A | * | 5/1990 | Mallik ............................ 359/1 |
| 5,054,683 A | | 10/1991 | Haisma et al. |
| 5,131,968 A | | 7/1992 | Wells et al. |
| 5,160,560 A | | 11/1992 | Welkowsky et al. |
| 5,172,250 A | * | 12/1992 | Tsuchiya et al. ............... 359/1 |
| 5,326,420 A | | 7/1994 | Vinouze et al. |
| 5,393,365 A | * | 2/1995 | Smith ......................... 156/219 |
| 5,433,911 A | | 7/1995 | Ozimek et al. |
| 5,466,319 A | * | 11/1995 | Zager et al. ................. 156/220 |
| 5,515,167 A | | 5/1996 | Ledger et al. |
| 5,543,228 A | | 8/1996 | Taniguchi et al. |
| 5,606,433 A | * | 2/1997 | Yin et al. ...................... 359/1 |
| 5,670,009 A | | 9/1997 | Tarn et al. |
| 5,760,864 A | | 6/1998 | Yamada et al. |
| 5,795,430 A | | 8/1998 | Beeteson et al. |
| 5,932,045 A | * | 8/1999 | Campbell et al. ........... 156/102 |
| 6,075,626 A | * | 6/2000 | Mizutani et al. ................ 359/3 |
| 6,156,415 A | | 12/2000 | Campbell et al. |
| 6,174,648 B1 | | 1/2001 | Terao et al. |
| 6,373,636 B1 | | 4/2002 | Conley |
| 6,407,859 B1 | | 6/2002 | Hennen et al. |
| 6,434,299 B1 | * | 8/2002 | Yudin et al. ................... 385/37 |
| 6,574,174 B1 | * | 6/2003 | Amble et al. ............ 369/44.26 |
| 6,671,073 B1 | * | 12/2003 | Hegel ............................ 359/3 |
| 2003/0044576 A1 | * | 3/2003 | Dhar et al. ................. 428/137 |

FOREIGN PATENT DOCUMENTS

| | | |
|---|---|---|
| WO | WO 95/11521 | 4/1995 |

OTHER PUBLICATIONS

"Device for Planarizing Structured Surfaces", IBM Technical Disclosure Bulletin, vol. 32, No. 5A, Oct. 89, pp. 402-403.

Hsin-Yu, Sidney Li et al., "Three-dimensional holographic disks", Applied Optics, vol. 33, No. 17, Jun. 10, 1994, pp. 3764-3774.

S. V. Pappu "Holographic memories; a critical review", Int. Journal of Optoelectronics, vol. 5, No. 3, 1990, pp. 251-292.

A. Pu et al., "A New Method for Holographic Data Storage in Photopolymer Films", IEEE/IEOS 1994, Symposium, pp. 433-435.

* cited by examiner

METHOD AND APPARATUS FOR MULTILAYER OPTICAL ARTICLES

CROSS-REFERENCE TO RELATED APPLICATIONS

This application claims the benefit of U.S. Provisional Application No. 60/314,320, entitled "Optically Flat, Multilayer Articles" filed Aug. 22, 2001 which is incorporated by reference herein in its entirety.

TECHNICAL FIELD

The present invention relates to the general field of optical articles. More specifically the invention relates to forming multilayer optical articles with improved optical properties.

BACKGROUND

Many optical systems require devices having specific optical properties, in particular, surface flatness, thickness uniformity, and/or bow. Surface flatness of an article is determined by measuring the variation of the article's surface from a specified surface profile (the profile, for example, may have a certain bow). The thickness uniformity is measured by the article's variation from a specified thickness or profile (e.g., parallel or wedge-shaped). Both of these parameters are typically measured in units of optical waves of variation from the specified profile per transverse distance, e.g., waves/cm, where the wave is a specified wavelength, e.g., of the particular light being used for measurement or for the ultimate use. When used herein, units of waves/cm indicate an average measurement over the area of the article intended to have the desired optical characteristics. Bow is a physical measurement, determined as shown by FIG. 1. The distance B from the center of an article to a line drawn between two contact points where a plane meets the article is divided by half of the distance Y of that line. The units (e.g., B cm/(Y/2) cm) divide out to give a unitless value. Methods for forming optical articles are discussed in U.S. Pat. No. 5,932,045, entitled "Methods for Fabricating a Multilayer Optical Article," and U.S. Pat. No. 6,156,415 entitled "Method for Fabricating a Multilayer Optical Article and a System Having a Multilayer Optical Article", both of which are incorporated by reference.

For optics applications, where one is concerned with the effect of an article on light passing through that article, physical thickness uniformity is typically not relied upon. Instead, a transmission flatness is determined by measuring the deviation of the optical path length (discussed below) from the preselected profile, and FIG. 2 shows this measurement for a configuration desired to have a uniform thickness (i.e., parallel surfaces). Transmission flatness is also presented in waves/cm, and, as known to those in the art, transmission flatness may also be expressed in rms (root mean squared) waves/cm or by the Strehl value, as discussed in J. W. Goodman, Introduction to Fourier Optics, McGraw-Hill, 1968. FIG. 2 shows two paths through a multilayer article, the paths located a distance z from each other transversely across the article. The physical path length difference across distance z is |l'−l|, and the variation from exact thickness uniformity is |l'−l|/z, which is typically measured in micrometers/cm. The physical path length is not affected by, nor does it take into account, the refractive indices of the individual layers 10, 12, and 14, or the wavelength of the light being used.

Optical path length (OPL) is the relevant parameter for transmission flatness and is represented by the following formula:

$$OPL = \sum_j n_j L_j,$$

where
$n_j$ is the refractive index of layer j and
$L_j$ is the physical path length through layer j.

In contrast to physical path length, the OPL depends on the refractive index. For example, in a multilayer article such as that of FIG. 2, the OPL depends on the refractive indices of layers 10, 12, and 14. Specifically, the OPL difference (ΔOPL) across the article of FIG. 2 is equal to:

$$|(n_{10}L_{10}+n_{12}L_{12}+n_{14}L_{14})-(n_{10}L'_{10}+n_{12}L'_{12}+n_{14}L'_{14})|$$

This equation shows that where the goal is a small OPL difference, if the substrates have relatively large individual thickness variations, but the overall thickness variation is relatively small, it is useful for the refractive indices of the substrates to be close. As reflected in FIG. 2, the transmission flatness, assuming a parallel configuration is desired, is therefore ΔOPL/z. For optics applications, it is clear that the variation from a selected profile in OPL is more meaningful than the change in physical path length per transverse unit.

Transmission and surface flatness values are presented in waves/cm, where the value given is for a specified wavelength. Use of such waves/cm herein indicates that the value is for the optical path length as opposed to the physical path length. For purposes of the present application, values in waves/cm are useful at least for wavelengths ranging from about 0.3 to about 0.9 micrometers, but the concept of the invention extends beyond this range.

For substrates typically used in optics applications, there are three basic types of thickness variations that affect surface and transmission flatness. The first type is a linear thickness change from low to high over the surface of the substrate, whereby the substrate essentially takes the form of a wedge. The thickness variation of such a substrate per unit length is relatively constant. The second type of a variation is a gradual, wavy, or random, variation, where the thickness varies, for example, from low to high to low to high gradually across the width of the substrate. The thickness variation of such a substrate per unit length is relatively constant, but the substrate does not take the form of a wedge. The third type of variation is localized, sharp divots or peaks. Such divots or peaks typically cause rapid variations in thickness measurements taken at different locations along a substrate and may therefore skew an rms measurement. Structures having this third type of variation are typically measured in terms of scratch and dig, as known in the art. Clearly, these characteristics often cause numerous difficulties when attempting to form structures with combinations of low surface smoothness variations, low thickness uniformity variations, and/or low bow.

Articles used in precise applications desirably have a surface and transmission flatness of 0.1 waves/cm or better. Articles for transmission applications where parallel surfaces are desired desirably have a bow of $10^{-2}$ or less (less meaning numerically smaller), and articles for reflection applications where parallel surfaces are desired desirably have a bow of $10^{-5}$ or less. It is difficult to prepare or obtain substrates or multilayer articles having such properties. High quality glass intended for flat panel displays (referred to herein as display glass), for example, will have surface and transmission flatness values ranging from about 0.25 to about 4 waves/cm. To obtain better, and more consistent flatness values, it is necessary to obtain a thick piece of glass and polish the glass to a desired flatness. Such chemical/mechanical polishing, however, is expensive and time-consuming, and may still be inadequate for preparing substrates and articles having the above properties. Easier and less expensive methods for improving the optical flatness of substrates and for forming optical articles, e.g., articles, having certain bow, thickness uniformity, and surface flatness, are desired, particularly for optical articles which have already been previously formed with inadequate surface flatness, thickness uniformity, or bow.

It is also possible for cells made according to the invention to be used for holographic storage. Memory cells for holographic data storage systems are discussed, for example, in H.-Y. Li et al., "Three-dimensional holographic disks," Appl. Opt., 33, pp. 3764–3774 (1994), and A. Pu et al., "A new method for holographic data storage in photopolymer films," Proceedings from IEEE/IEOS 1994 Symposium, pp. 433–435, the disclosures of which are hereby incorporated by reference. It is desirable for the cells to have a surface and transmission flatness of about 0.25 waves/cm or better and a bow of about $10^{-2}$ or less. Conventional methods of disposing photopolymers between substrates do not provide these properties. Thus, there has been a need for holographic memory cells that have these properties. In addition, there has been a need for memory cells for holographic data storage systems with increased storage capacity.

SUMMARY OF THE INVENTION

The present invention provides a solution to the needs described above through a method and apparatus for a multilayer holographic memory cell.

In an embodiment of the invention, a method for fabricating a multilayer optical article is presented comprising the steps of providing a first substrate with a first surface and a second surface, providing a second substrate with a first surface and a second surface, and providing a third substrate with a first surface and a second surface. The first surface of the first substrate is grasped with a first holder, where the first surface of the first substrate is held to an inner surface of the first holder. The first surface of the second substrate is grasped with a second holder, where the first surface of the second substrate is held to an inner surface of the second holder. The inner surfaces of the first and second holders are arranged to face one another in a selected angular relationship. A first adherent is disposed on one or more surfaces selected from a second surface of the first substrate and a second surface of the second substrate. The first adherent is at least partially cured while the first and second holders maintain their grasp and while the inner surfaces of the first and second holders are in a selected distance relationship and the selected angular relationship to form a first multilayer article.

The first holder from the first multilayer article is released and a first surface of the third substrate is grasped with the released first holder, whereby the first surface of the third substrate is held to an inner surface of the first holder. A second adherent is disposed on one or more surfaces selected from a second surface of the third substrate and the first surface of the first substrate of the formed multilayer article. The second adherent is then at least partially cured while the first and second holders maintain their grasp and while the inner surfaces of the first and second holders are in a selected distance relationship and angular relationship to form a second multilayer article. After removal of the first and second holders the at least partially cured first and second adherent maintains the second multilayer article in a posture at which the second multilayer article was held by the first and second holders, wherein the first and second adherent comprise a photopolymer such that the article is capable of storing data in a holographic data storage system, and wherein at least one of the inner surface of the first holder and the inner surface of the second holder has a surface flatness of about 0.05 to about 1 waves/cm for wavelengths of about 0.3 to about 1.60 μm.

An embodiment of the invention presents a multilayer optical article comprising a first substrate, a second substrate, and a third substrate. A first layer of partially cured adherent is disposed between the first surface of the first substrate and the second substrate and a second layer of partially cured adherent is disposed between the second surface of the first substrate and the third substrate. The first and second adherent comprise a photopolymer such that the article is capable of storing data in a holographic data storage system. The multilayer optical article has a surface flatness of about 0.05 waves/cm to about 1 wave/cm at wavelengths of about 300 nanometers to 1600 nanometers, and a first layer bounded by a first surface of the first substrate and a first surface of the second substrate and a second layer bounded by a first surface of the first substrate and a first layer of the third substrate each have a transmission flatness of about 0.05 waves/cm to about 1 wave/cm at wavelengths of about 300 nanometers to 1600 nanometers.

An embodiment of the invention provides a method for fabricating a multilayer reflective holographic memory cell. A first embodiment comprises grasping a first surface of a first substrate with a first holder, whereby the first surface of the first substrate is held to an inner surface of the first holder. The first surface of the first substrate is coated with an optically reflective material. A first surface of a second substrate is grasped with a second holder, whereby the first surface of the second substrate is held to an inner surface of the second holder. The inner surfaces of the first and second holders are arranged to face one another in a selected angular relationship. An adherent is disposed on one or more surfaces selected from a second surface of the first substrate and a second surface of the second substrate. The first adherent is at least partially cured while the first and second holders maintain their grasp and while the inner surfaces of the first and second holders are in a selected distance relationship and the selected angular relationship to form a first multilayer article. The first multilayer article is released from the first holder. The first surface of the third substrate is then grasped with the released first holder, whereby the first surface of the third substrate is held to an inner surface of the first holder. A second adherent is then disposed on one or more surfaces selected from a second surface of the third substrate and the reflective first surface of the first substrate of the formed first multilayer article. The second adherent is then at least partially cured while the first and second holders maintain their grasp and while the inner surfaces of the first and second holders are in a selected distance relationship and angular relationship to form a second multilayer article. After removal of the first and second holders the at least partially cured first and second adherent maintains the second multilayer article in a posture at which the second multilayer article was held by the first and second holders, wherein the first and second adherent comprise a photopolymer such that the article is capable of storing data in a reflective holographic data storage system, and wherein at least one of the inner surface of the first holder and the inner surface of the second holder has a surface flatness of about 0.05 to about 1 waves/cm for wavelengths of about 0.3 to about 1.6 µm. In a further embodiment of the invention, the optically reflective layer is deposited on the outer surface of the first substrate of the first multilayer article after the first multilayer article is formed.

A further embodiment of the invention presents a multilayer reflective holographic storage system comprising a first substrate with an optically reflective surface, a second substrate, and a third substrate. A first layer of partially cured adherent is disposed between the first surface of the first substrate and the second substrate. A second layer of partially cured adherent is disposed between the second surface of the first substrate and the third substrate. The first and second layers of adherent are a photopolymer material such that the article is capable of storing data in a reflective holographic data storage system. The article has a surface flatness of about 0.05 waves/cm to about 1 wave/cm at wavelengths of about 300 nanometers to 1600 nanometers, and the force exerted by the adherents on the first, second, and third substrates maintains the surface flatness. A multilayer bounded by the first surface of the first substrate and the first surface of the second substrate and a multilayer bounded by the first surface of the first substrate and the first surface of the third substrate each have a transmission flatness of 0.05 waves/cm to about 1 wave/cm at wavelengths of about 300 nanometers to 1600 nanometers.

Still other embodiments of the present invention will become apparent to those skilled in the art from the following detailed description, wherein is shown and described only the embodiments of the invention by way of illustration of the best modes contemplated for carrying out the invention. As will be realized, the invention is capable of modification in various obvious aspects, all without departing from the spirit and scope of the present invention. Accordingly, the drawings and detailed description are to be regarded as illustrative in nature and not restrictive.

DESCRIPTION OF THE DRAWINGS

The features and advantages of the system and method of the present invention will be apparent from the following description in which:

FIG. 3b shows a cross-sectional side view, along line a–a', of the holder of FIG. 3a.

FIG. 4b shows a cross-sectional side view, along line b–b', of the holder of FIG. 4a.

DETAILED DESCRIPTION

Figure 1:
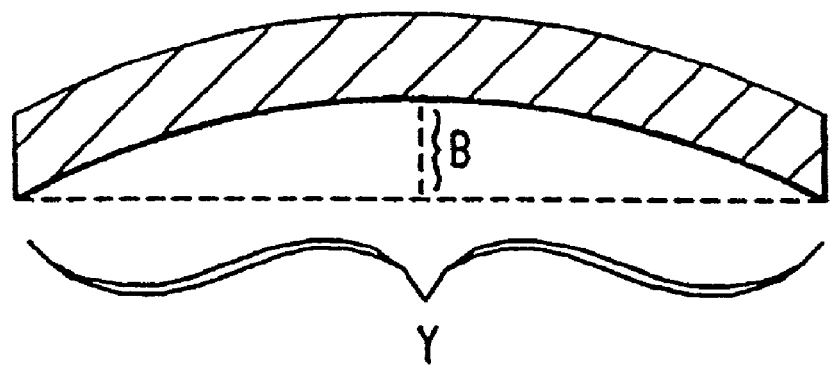
FIG. 1 illustrates bow in an article.
Figure 2:
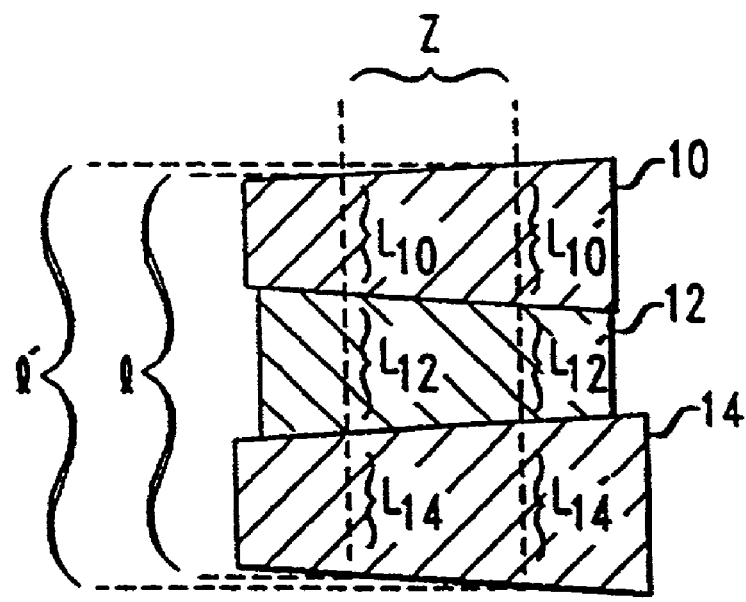
FIG. 2 illustrates physical and optical path length through a multilayer article.

The invention relates to multilayer optical articles and methods for fabricating multilayer optical articles. In one embodiment, the method comprises the steps of:
  providing a first substrate with a first surface and a second surface;
  providing a second substrate with a first surface and a second surface;
  providing a third substrate with an first surface and a second surface;
  grasping the first surface of the first substrate with a first holder, whereby the first surface of the first substrate is held to an inner surface of the first holder, the grasping performed by application of a vacuum;
  grasping an first surface of the second substrate with a second holder, whereby the first surface of the second substrate is held to an inner surface of the second holder, the grasping performed by application of a vacuum;
  arranging the inner surfaces of the first and second holders to face one another in a selected angular relationship;
  disposing a first adherent on one or more surfaces selected from a second surface of the first substrate and a second surface of the second substrate;
  at least partially curing the first adherent while the first and second holders maintain their grasp and while the inner surfaces of the first and second holders are in a selected distance relationship and the selected angular relationship to form a first multilayer article;
  releasing the first holder from the first multilayer article;
  grasping a first surface of the third substrate with the released first holder, whereby the first surface of the third substrate is held to an inner surface of the first holder, the grasping performed by application of a vacuum;
  disposing a second adherent on one or more surfaces selected from an second surface of the third substrate and the reflective first surface of the first substrate of the formed multilayer article;
  at least partially curing the second adherent while the first and second holders maintain their grasp and while the inner surfaces of the first and second holders are in a selected distance relationship and the selected angular relationship to form a second multilayer article;
  wherein after removal of the first and second holders the at least partially cured first and second adherent maintains the second multilayer article in a posture at which the second multilayer article was held by the first and second holders, wherein the first and second adherent comprise a photopolymer such that the article is capable of storing data in a reflective holographic data storage system, and wherein at least one of the inner surface of the first holder and the inner surface of the second holder has a surface flatness of about 0.05 to about 1 waves/cm for wavelengths of about 0.1 to about 1.6 µm.

To maintain the surface flatness, transmission flatness, and/or bow, the inner surface of the holder or holders must comprise a continuous surface portion to which at least a portion of the substrate substantially conforms. As used herein, the term holder is intended to define an article comprising, among other things, such a continuous surface portion. The continuous surface portion does not have a discontinuity that would allow for non-conformance of the substrate. (It is possible for the continuous surface portion to have relatively small discontinuities, e.g., small holes, as long as the discontinuities do not allow for such nonconformance.) It is possible for the continuous surface portion to be bounded by an area where a grasping force is applied, e.g., a vacuum groove (such as in FIGS. 3a and 3b), or for the grasping force to be applied at more than one area around and/or within the continuous surface portion, e.g., several vacuum grooves (such as in FIGS. 4a and 4b) or several vacuum holes. It is also possible for the grasping force to be applied through the entire continuous surface portion, e.g., by an electromagnetic material. It is over this continuous surface portion that the flatness and/or bow is maintained.

Figure 3A:
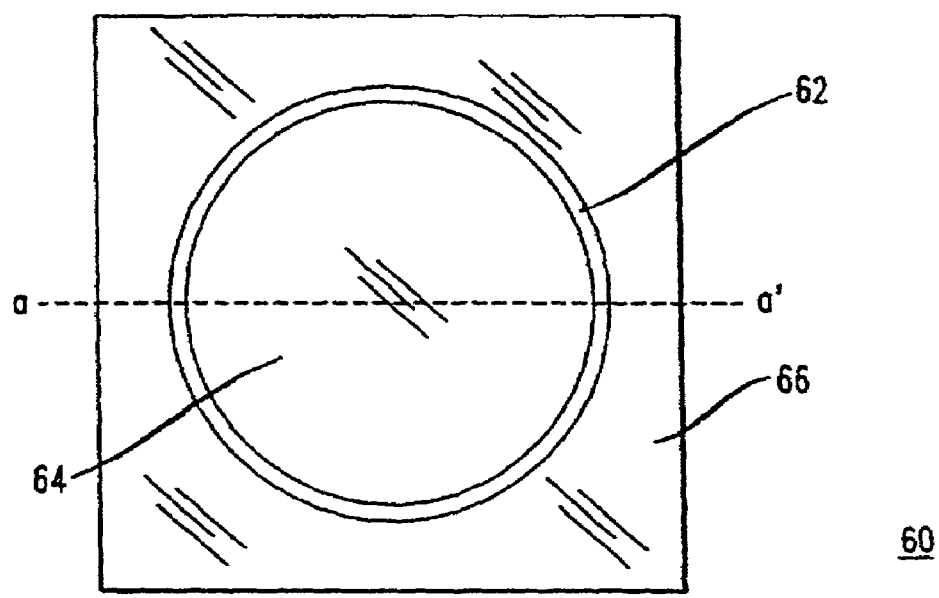
FIG. 3a shows the inner surface of a holder of one embodiment of the invention.
Figure 3B:
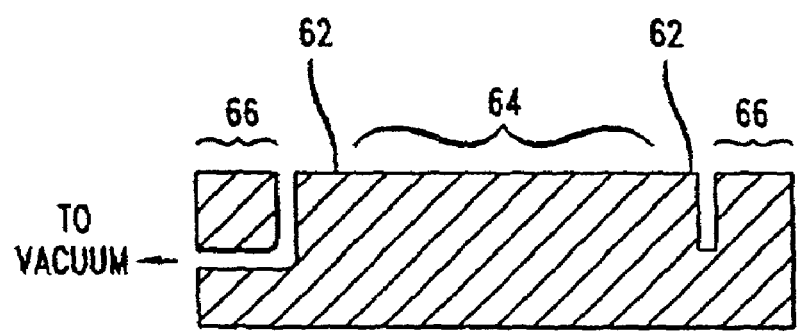

FIGS. 3a and 3b show a holder 60 suitable for use in the invention that contains such a continuous surface portion. (FIG. 3b is a cross-sectional side view along line a–a' of FIG. 3a.) The holder 60 contains a single vacuum groove 62 that is attached to a vacuum (not shown). The vacuum groove 62 bounds a continuous surface 64 to which a substrate will substantially conform upon application of the vacuum. Surface 66 of the holder 60 is outside the vacuum groove 62, and is not part of a continuous surface portion. A substrate would not be forced to substantially comply with the surface 66 upon application of a vacuum.

Figure 4A:
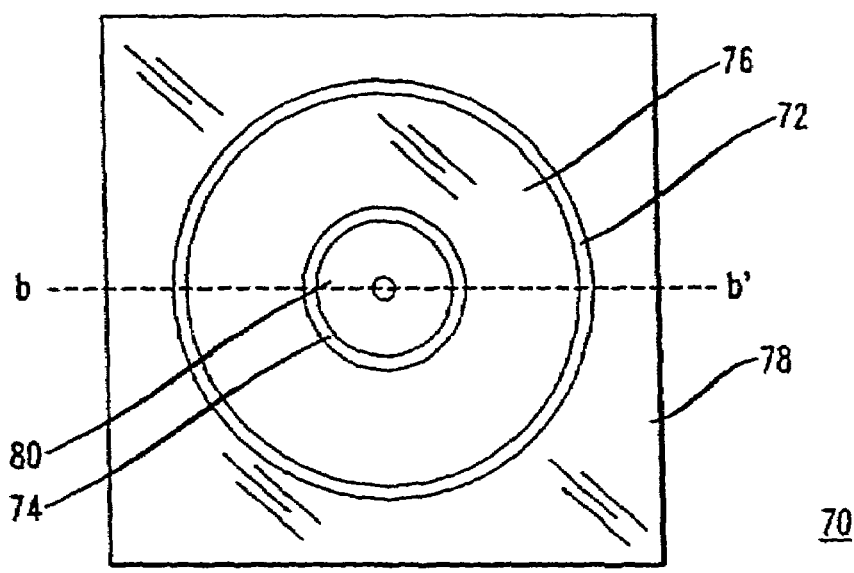
FIG. 4a shows the inner surface of a holder of another embodiment of the invention.
Figure 4B:
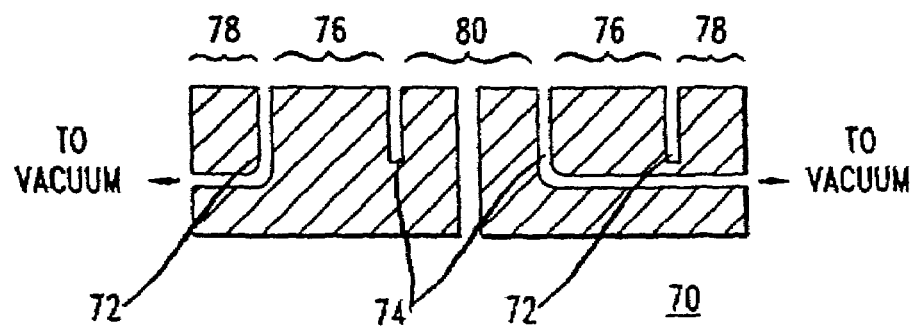

FIGS. 4a and 4b show another holder 70 suitable for use in the invention. (FIG. 4b is a cross-sectional side view along line b–b' of FIG. 4a.) The holder 70 contains two vacuum grooves-an outer vacuum groove 72 and an inner vacuum groove 74. A continuous surface 76 lies between groove 72 and groove 74. Surface 78 (lying outside the outer vacuum groove 72) is not part of a continuous surface portion. Also, as shown in FIGS. 4a and 4b, it is possible for holder 70 to have a hole located at the area of surface 80, in which case surface 80 is also not part of a continuous surface portion.

In a case where the holder uses electromagnetic force to grasp a substrate, it is possible for the continuous surface portion to apply the force over its entirety, or for the continuous surface portion to have a particular area around its periphery, e.g., in the shape of a ring or a square, in which the force is applied. In the latter embodiment, the posture of the substrate will be maintained over and within the ring or square in which the force is applied.

In contrast to the holder embodiments above, a vacuum ring does not constitute a holder in accordance with the invention, because the vacuum groove of the ring does not bound a continuous surface portion-the gap in the middle of the ring provides a discontinuity that allows non-conformance of a substrate.

The inner surfaces of the holders of the invention have an optically desirable shape and/or surface. Advantageously, the inner surface of a holder has a surface flatness of about 0.05 to about 1 waves/cm. Also advantageously, the inner surface of a holder has a bow of about $10^{-2}$ or better, particularly for articles intended for transmission applications, whereas a bow of about $10^{-5}$ or better is advantageous for articles intended for reflective applications. It is possible for the steps of these embodiments to be performed in an order other than the order presented above.

Advantageously, the multilayer articles of the invention have surface flatness and transmission flatness values of about 0.05 to about 1 waves/cm, these numbers useful for at least wavelengths of about 0.3 to about 1.6 μm, although the concept of the invention extends beyond this range. Also advantageously, the articles have a bow of about $10^{-2}$ or less, and more advantageously, about $10^{-5}$ or less (particularly for reflective applications).

It is advantageous for the selected angular relationship between the inner surfaces of the holders to be a parallel relationship, meaning that the distance between the continuous surface portions of the inner surfaces of the two holders (optionally the whole of the inner surfaces) does not vary by more than about 1 wave/cm. A multilayer article having parallel substrates advantageously has surface flatness and transmission flatness values of about 0.05 to about 1 waves/ cm, a Strehl value of 0.5 or greater (more advantageously 0.9 or greater) and a bow of about $10^{-2}$ or less.

The adherent is advantageously disposed in a continuous layer. The improved flatness and/or bow of the substrate or multilayer article is primarily attained in the area where the adherent contacts a substrate or substrates. The area of the adherent is typically within the area of the continuous surface portion of the holder or holders. Portions of the substrate or substrates that extend past the area of the adherent, and especially past the area of the continuous surface portion tend to return to their initial state after the holder or holders are removed. When flatness, Strehl value, and bow of a substrate or an article are discussed herein, the flatness, Strehl value, or bow referred to is of this area where the adherent maintains the flatness and/or bow of a substrate or the flatness and/or bow of a multilayer article.

A present embodiment of the invention relates to a system, e.g., an optical system, containing a multilayer article that comprises two substrates and a third substrate with a reflective surface and layers of at least partially cured adherent adhered to the substrate or substrates, wherein the article has surface flatness and transmission flatness values of about 0.05 to about 1 waves/cm, preferably, 0.05 to about 0.5 waves/cm, and wherein the force exerted by the adherents on the substrates maintains this flatness. The article also has a bow of about $10^{-2}$ or less (advantageously about $10^{-5}$ or less for reflective applications), and, in such applications, the force exerted by the adherents on the substrates maintains the bow as well. It is possible for the system to be a holographic storage system, in particular, a digital holographic data storage system. The elements of holographic storage systems are discussed, for example, in the articles cited above, as well as S. Pappu, "Holographic memories; a critical review," Int. J. Optoelect., 5, pp. 251–292 (1990); L. Hesselink et al., "Optical memories implemented with photorefractive media," Opt. Quant. Elect., 25, §§ 611–661 (1993); and D. Psaltis et al., "Holographic Memories," Scientific American, November 1995, the disclosures of which are hereby incorporated by reference.

Figure 5:
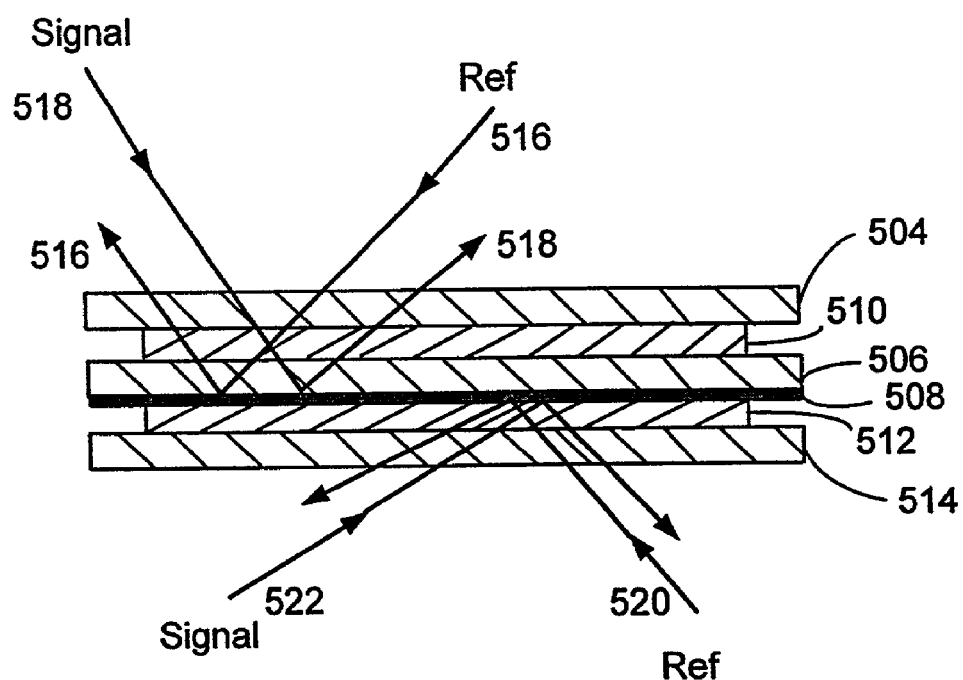
FIGS. 5a and 5b illustrate an embodiment of a reflective multilayer holographic memory cell.

In accordance with an embodiment of the invention, a reflective multilayer holographic memory cell is shown in FIG. 5a. The reflective multilayer holographic memory cell comprises outer substrates 504 and 514 and an inner substrate 506. Inner substrate 506 has a reflective surface 508 on one side of the substrate. In alternative embodiments, inner substrate 506 does not have reflective surface 508. The reflective multilayer holographic memory cell has two layers of adherent. Adherent 510 is located between substrate 504 and substrate 506. Adherent 512 is located between substrate 514 and substrate 506. Layers of adherent 510 and 512 are photopolymers capable of storing data in a holographic data storage system after a cure. The holographic memory cell utilizing substrate 506 with reflective material layer 508 allows for independent holographic data storage in layers of adherent 510 and 512.

In alternative embodiments, outer substrates 504 and 514 and inner substrate 506, can be coated with a combination of transparent, partially transparent, partially reflective, and reflective materials or coated with such materials in a patterned fashion.

Referring to FIG. 5a recording of holograms in adherent layers 510 and 512 is shown. A signal beam 518 interferes with a reference beam 516 in the photopolymer adherent 510 to form a hologram. Signal beam 518 and reference beam 516 enter adherent 510 from the same side and reflect off of the reflective material 508 of substrate 506 thereby preventing the signal and reference beam from interacting with adherent 512. A hologram can be recorded in adherent 512 by the intersection of signal beam 522 with reference beam 520. Signal beam 522 and reference beam 520 reflect off of reflective material 508 of substrate 506 thereby preventing signal beam 522 and reference beam 520 from entering adherent 510.

Figure 5B:
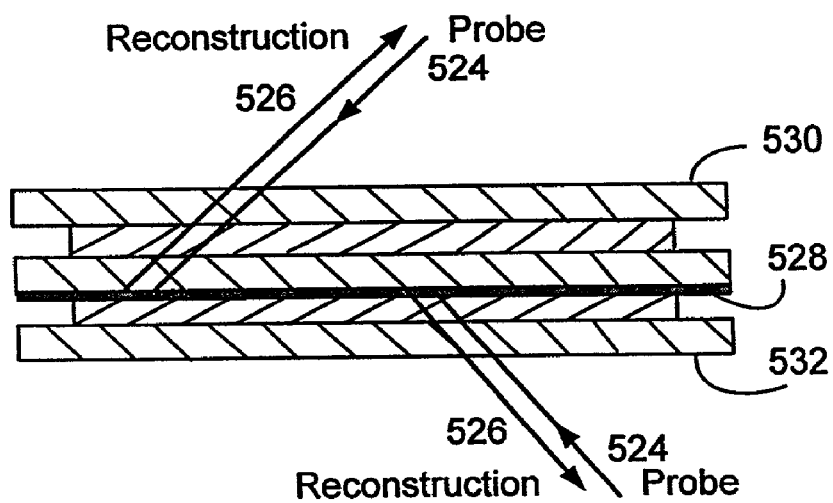

Referring to FIG. 5b retrieval of holograms stored in the reflective multilayer holographic memory cell is shown. A holograph recorded in adherent 510 is retrieved by projecting a probe beam 524 into the adherent 510 from the same side and at the same angle at which the holograph was recorded. The reconstructed hologram is reflected off the reflective layer 508 of substrate 506 resulting in a reconstruction beam 526. Similarly, a hologram is read from adherent 512 via a probe beam 524 producing a reconstruction beam 526 reflected off the reflective material 508 of substrate 506.

Utilizing an embodiment of the method of the present invention, the reflective layer 508 of substrate 506 has a surface flatness of about 0.05 to about 1 waves/cm, more advantageously, about 0.05 to about 0.5 waves/cm. In addition, the inner layers also have a transmission flatness of 0.05 waves/cm to about 1 wave/cm at wavelengths of about 300 nanometers to 1600 nanometers. Referring to FIG. 5b, one multilayer bounded by a surface 528 of the inner substrate 506 and outer surface 530 of substrate 504 has a transmission flatness of 0.05 waves/cm to about 1 wave/cm at wavelengths of about 300 nanometers to 1600 nanometers. A multilayer bounded by a surface 528 of the inner substrate 506 and outer surface 532 of outer substrate 532 has a transmission flatness of 0.05 waves/cm to about 1 wave/cm at wavelengths of about 300 nanometers to 1600 nanometers. This surface and transmission flatness prevents the probe and reconstructed beam 524 and 526 from being distorted when entered the medium and reconstructing the hologram, allowing detection for more accurate imaging and detection of reconstruction beam 526 by a detector array (not shown).

In forming a multilayer reflective holographic memory cell, three substrates are advantageously used, and are advantageously the same material. The substrates are advantageously selected from glass, sapphire, polycarbonate, and quartz. Any other material that is transparent to the wavelength being used in the holographic storage system, and which has adequate mechanical properties for a memory cell, may also be used as a substrate. The substrates are advantageously about 0.1 to about 1 mm thick. An initial substrate will typically have surface flatness and transmission flatness values of about 0.1 to about 10 waves/cm, and a bow of about 0.1 or less. Commercially available display glass exhibits these properties, and is typically free from significant divots and peaks, meaning scratch and dig of 40/100 or better. Alternatively, substrates made from materials such as polycarbonate, polymethyl methacrylate, polyolefins, or other common plastic materials may also be used. Such glass and plastic substrates are suitable for fabrication of a memory cell. The reflective material formed on the substrate between the two layers of adherent may be wavelength dependent, reflecting certain wavelengths of laser light while transmitting others. The reflective layer may be aluminum, gold, copper, or any other suitable material. The reflective material may be deposited on the substrate through vacuum evaporation, vacuum deposition, physical vapor deposition, or other suitable technique.

As discussed above, having an adherent with a refractive index close to that of the substrates is advantageous because a near-uniform refractive index throughout a multilayer article will reduce variations in OPL. In fabricating a holographic memory cell for digital holography, it is advantageous for the refractive index of the first substrate to be equivalent to two decimal places to the refractive index of the second substrate, and for the refractive index of the adherent to be equivalent to two decimal places to the average of the refractive indices of the first and second substrates.

It is also advantageous for the adherent in a holographic cell to be applied in a continuous layer, and for the adherent to be a photopolymer, i.e., capable of storing data in a holographic data storage system after a cure. Photopolymers such as those discussed above have been found to be useful adherents for holographic memory cells made according to the invention because these materials function both as adherents and as photosensitive recording media. After the cure, the thickness of the adherent in a memory cell is advantageously about 0.2 to about 2 mm. The post-cure memory cell advantageously has surface flatness and transmission flatness values of about 0.05 to about 1 waves/cm, more advantageously, about 0.05 to about 0.25 waves/cm, and a bow of about $10^{-2}$ or less. The memory cell also advantageously has a Strehl value of about 0.9 or greater. As discussed above, these properties refer to the area of the multilayer article within the area of the continuous surface portions of the inner surfaces of the holders, and primarily where the adherent contacts the substrates. The areas of the substrates extending past the adherent-contact area typically will not exhibit these properties.

A useful quality factor, or Q, for evaluating the properties of a memory cell made according to the method of the present invention is the Strehl value divided by the waves/cm rms transmission flatness, as measured over a predetermined area, such as a 50 mm diameter circle. Advantageously, memory cells made according to the method of the present invention have a Q greater than 1, and more advantageously, greater than 4. As a comparison, display glass typically has a Q of about 0.5, window glass a Q of about 0.05. In the absence of the invention's steps of grasping substrates such that they substantially comply with at least the continuous surface portions of the inner surfaces of the holders, cells consisting of two substrates with adherent disposed in between would have a Q of about 0.08, primarily due to the initial Strehl of the glass, holder distortions, and shrinkage of the adherent.

In accordance with an embodiment of the invention forming a reflective multilayer holographic memory cell as shown in FIGS. 6a–6f, two holders 100, 102 having inner surfaces with relatively low bow are brought into a selected angular relationship (in this embodiment, a parallel relationship). For simplicity, the continuous surface portions of the inner surfaces of holders 100, 102 are not shown. It is possible, for example, for holder 100, 102 to have the configuration of FIGS. 3a and 3b or FIGS. 4a and 4b. In this embodiment, the two holders 100, 102 are arranged to allow them to be manipulated into a parallel relationship and moved toward each other. For example, it is possible for holder 102 to be attached to gimbals that rotate in pitch and yaw (i.e., about its x- and y-axes), and holder 100 to be attached to an apparatus above holder 102 such that holder 100 is fixed in the pitch-yaw (i.e., x-y) plane but is capable of movement along the z-axis. It is possible to use a Fizeau interferometric method such as discussed in E. Hecht, Optics, Addison-Wesley Publishing, 1987, or a similar method known in the art, to measure the parallelism of the inner surfaces of the holders 100, 102 and allow for appropriate corrections. Such methods are also capable of measuring any selected angular relationships between holders.

Figure 6A:
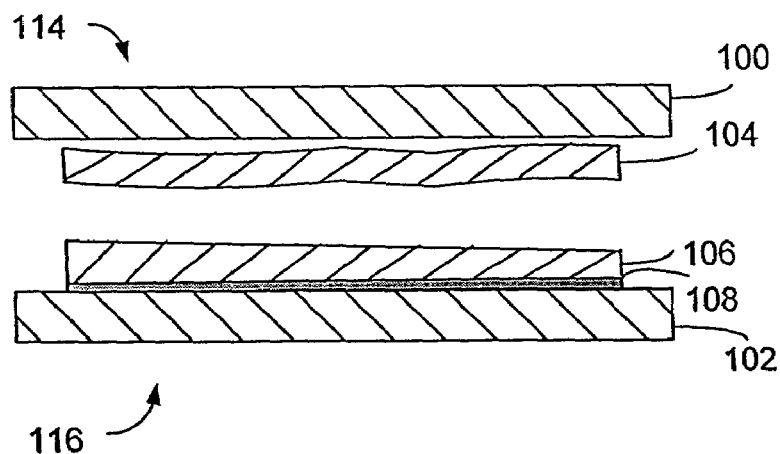
FIGS. 6a–6f show steps in a further embodiment of the method of the invention.

Once the holders 100, 102 are arranged in the parallel relationship, substrates 104, 106 are placed onto the holders 100, 102, which hold the outer surfaces of the substrates 104, 106 by one of several methods discussed below. In a reflective multilayer holographic memory cell application, substrate 106 has a layer of reflective material 108 on its outer surface. (In other embodiments of the invention, it is possible for the inner surfaces of the holders to be brought into a parallel relationship at later stages in the process, e.g., after the substrates 104, 106 are placed onto the holders 100, 102.) FIG. 6a shows the holders 100, 102 and substrates 104, 106 before the substrates 104, 106 are held to the surfaces of the holders 100, 102. Substrate 104 is shown with gradual, wavy thickness variations, and substrate 100 is shown with a wedge type variation.

Figure 6B:
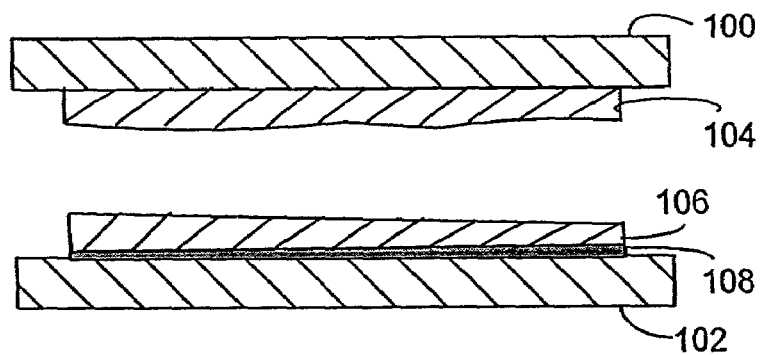

As shown in FIG. 6b, a force or attraction causes the outer surfaces of the substrates 104, 106 to substantially comply to the continuous surface portions (not shown) of the holders 100, 102. It is possible for the outer surfaces of the substrates 104, 106 to be held by vacuum, by electrostatic or magnetic attraction, or by a temporary chemical bond such as an adhesive. In certain cases where a temporary bond or electrostatic attraction are used, such as where thin, flexible substrates are used, the substrates 104, 106 will have to be pressed upon the holders 100, 102 in a manner that provides compliance to the surfaces of the holders 100, 102. One such manner is the use of a roller. Once the outer surfaces of the substrates 104, 106 are held onto the inner surfaces of holders 100, 102, the Fizeau or similar method is able to confirm the parallelism of the inner surfaces of the holders 100, 102, if the substrates 104, 106 are of a transparent material that allows use of the method. For example, if the substrates 104, 106 are transparent and have an anti-reflective coating on the side contacting the holder, it is possible for a Fizeau method to be used successfully. As discussed above, the inner surfaces of holders 100, 102 contain a continuous surface portion.

Figure 6C:
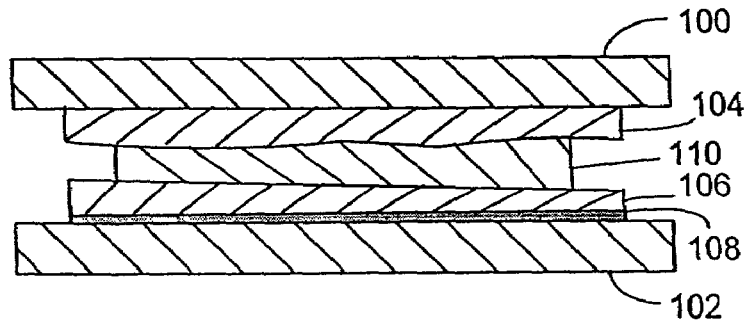

In accordance with this embodiment of the invention, with the substrates 104, 106 held in compliance with the flat surfaces of the holders 100, 102, an adherent 110 is applied to an inner surface of substrate 106. It is also possible to apply the adherent at an earlier stage in the process. Holders 100 and 102 are positioned in a selected distance relationship. Holder 100 brings the inner surface of substrate 104 into contact with the adherent 110 while the inner surfaces of the holders 100, 102 (and thus the outer surfaces of the first and second substrates 104, 106) are kept in the parallel relationship, as shown in FIG. 6c. The holders 100, 102 should press the substrates 104, 106 together with enough force to obtain a desired spread of adherent 110 between the substrates 104, 106 and/or obtain a desired level of contact between the adherent 110 and substrates 104, 106. It is useful to perform the Fizeau or similar method to confirm parallelism while the holders 100, 102 are grasping the substrates 104, 106 and pressing the substrates 104, 106 together with the adherent 110, and before curing the adherent 110.

The adherent 110 is then at least partially cured such that when the holders 100, 102 are removed, the rigidity or force exerted on the inner surfaces of the substrates 104, 106 by the adherent 110 maintains the substantially parallel relationship (i.e., the low bow) and the surface and flatness imparted to the outer surfaces of the substrates 104, 106. The bow and flatness are maintained within the area of the continuous surface portions of the holders 100, 102, and primarily in the area contacted by the adherent 110, as discussed above. The forces involved in maintaining this relationship are discussed below.

Figure 6D:
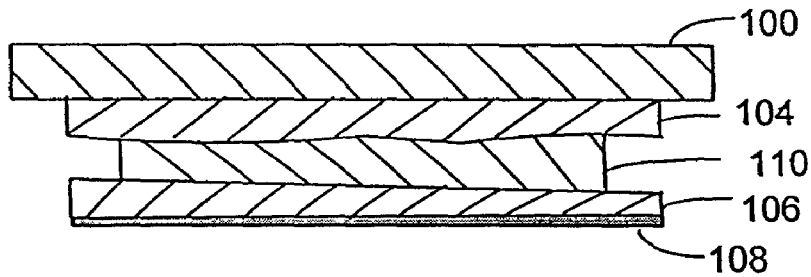
Figure 6E:
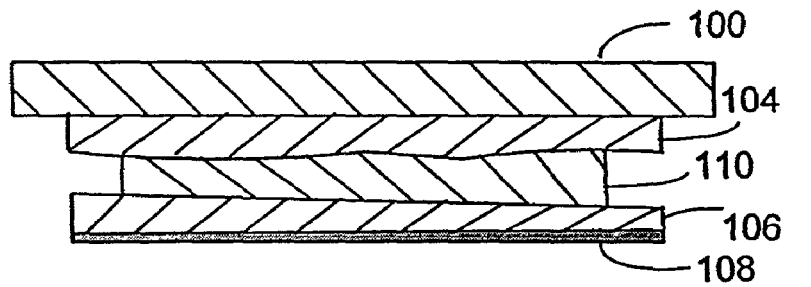
Figure 6F:
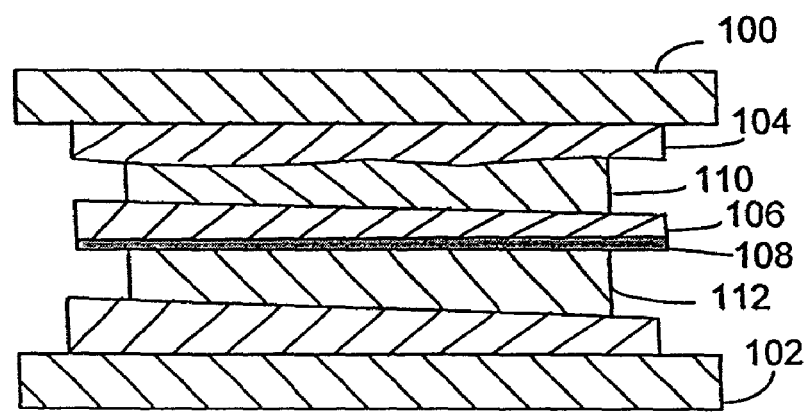

As shown in FIG. 6d holder 102 is then released from the reflective surface 108 of substrate 106. The surface flatness imparted to the outer surface 108 is maintained by the partially cured adherent 110. As shown in FIG. 6e, a third substrate 114 is then inserted between holder 102 and substrate 106. A force or attraction causes the outer surface of substrate 114 to substantially comply with the continuous surface portions (not shown) of the holder 102. The force or attraction may be caused by a vacuum, by electrostatic or magnetic attraction or by a temporary chemical bond such as an adhesive. Once the outer surface of the substrate 114 is held onto the inner surface of holder 102, the fizeau or similar method is able to confirm the parallelism of the inner surfaces of the holders 100, 102, if the substrate 104, 114 are of a transparent material that allows use of the method. In accordance with an embodiment of the invention with the substrate 114 held in compliance with the flat surface of holder 102, an adherent 112 is applied to the inner surface of substrate 114. Holder 102 brings the inner surface of substrate 114 into contact with the adherent 112 while the inner surfaces of 100 and 102 (and thus the outer surfaces of substrate 104 and 114 and surface 108 of substrate 106) are kept in the parallel relationship as shown in FIG. 6f. The holders 100 and 102 should press the substrate 114 and the outer surface 108 of substrate 106 together with enough force to obtain a desired spread of adherent 112 between the substrate 114 and the substrate 106. The adherent 112 is then at least partially cured such that when the holders 100 and 102 are removed the rigidity or force exerted on the inner surfaces of the substrate 114 and the surface 108 of substrate 106 by the adherent 112 maintains the substantially parallel relationship and the surface flatness imparted to the outer surfaces of the substrate 104 and substrate 114 as shown in FIG. 6F.

For ease of discussion, the holders 100, 102 are described in this embodiment as separate holders. It is possible, however, for the holders to be two pieces of a single part. In an alternative embodiment, substrate 106 does not have a layer of predeposited reflective material. Rather, the reflective material is deposited on the outer surface of one of the substrates of a two substrate multilayer article after the two substrate article is formed. A third substrate and second layer of adherent are then added using the above described process.

The method of the present invention is advantageously performed in a clean room environment. Among other things, a clean room helps prevent contaminants such as dust particles from lodging between the holders, substrates, and/or adherent. With thickness variations measured in wavelengths, it is apparent that even a single dust particle (typically having a diameter of 1 to 10 wavelengths) affects the flatness of the overall article.

The adherent is disposed onto the substrate or substrates by any suitable method, and is used in liquid or solid form. The adherent comprises any material that sufficiently adheres and/or provides rigidity to the substrate or substrates such that the upon removal of the holders the substrate or multilayer article is maintained in a posture at which it was held by the holder or holders.

Figure 7:
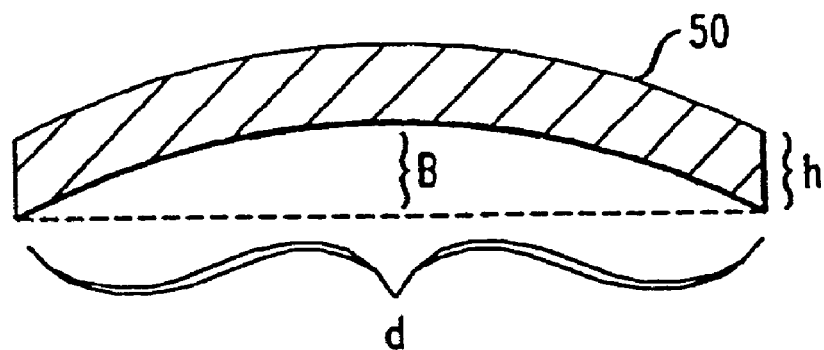
FIGS. 7 and 8 illustrate the forces required to maintain the optical characteristics of articles made according to the invention.
Figure 8:
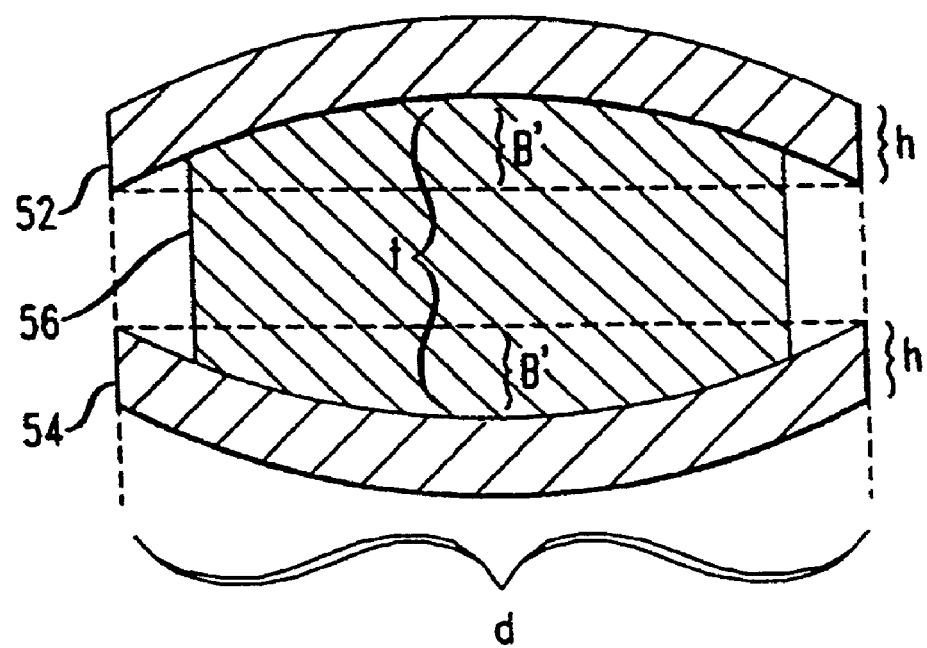

While not limiting the invention to any particular model or theory, it is believed that the force required for maintenance of the posture can be represented by the following simplistic model, for both a single substrate and for two substrates. See also L. D. Landau et al., Theory of Elasticity, Pergamon Press, Oxford, 3d English Ed., 1986, particularly page 44. For the equations below, the substrates are circular and initially have spherical bow, and the goal is to achieve a bow of zero. For a single substrate 50, as reflected in FIG. 7, the pressure difference across the substrate, P, necessary to produce compliance (i.e., reducing the bow to zero) is given by:

$$P = \left(\frac{256}{3}\right)\left(\frac{bh^3}{d^4}\right)\left(\frac{E}{(1-\sigma)(5+\sigma)}\right)$$

where:
h=substrate thickness
b=height of substrate bow in center
d=diameter of substrate
P1=air pressure on free surface of substrate
P2=air pressure on vacuum flat surface of substrate
P=P1−P2=pressure difference across substrate
σ'=Poisson's ratio of substrate
E=Young's modulus of substrate In the three-layer article of FIG. 8, there will exist a residual bow height, b', as the substrates 52, 54 (each having an initial bow height, b, as above) attempt to return to their original form and thereby push against the adherent layer 56. Additional parameters for this model are:
b'=residual bow height in three-layer article
t=bonding layer thickness (t>>b')
σ'=Poisson's ratio of adherent layer
E'=Young's modulus of adherent layer For this simplified model, the ratio of the final cell surface bow height to the cell diameter is given by:

$$\left(\frac{b'}{d}\right) = \left(\frac{128}{3}\right)\left(\frac{E}{E'}\right)\left(\frac{bh^3 t}{d^5}\right)\left(\frac{(1+\sigma')(1-2\sigma')}{(1-\sigma')(1-\sigma')(5+\sigma')}\right)$$

The adhesive strength between the adherent layer and the substrates thus needs to exceed the pressure differential P that is required to displace either substrate by an amount equal to (b−b'). For example, for b'<0.1 micrometers (approximately 0.2 wavelengths), d equal to 50 mm, t equal to 1 mm, E/E' equal to 2, σ' equal to approximately 0.25, σ' equal to approximately zero, and h equal to 1 mm, the limit for initial substrate bow (2b/d) is less than ¼.

It is possible for the adherent to be photocurable or otherwise curable, e.g., heat or chemical curable. It is also possible for the adherent to be a material that undergoes a phase transformation, e.g., liquid to solid, to attain a required adherence. As used herein, the terms cure and curable are intended to encompass materials that gel or solidify by any such methods. Photocurable adherents include materials that cure upon exposure to any of a variety of wavelengths, including visible light, UV light, and x-rays. It is also possible to use adherents that are curable by electron or particle beams. Useful adherents include photocurable adherents that are photosensitive (referred to as photopolymers), the term photosensitive meaning a material that changes its physical and/or chemical characteristics in response to exposure to a light source (e.g., selective, localized exposure). Such photosensitive adherents include but are not limited to certain photosensitized acrylates and vinyl monomers. Photosensitive adherents are useful because they act as both an adherent and a recording media. Adherents such as those based on epoxides are also useful. One example of a useful photopolymer is a isobornyl acrylate-polytetrahydrofuran diurethane diacrylate matrix with n-vinylcarbazole dispersed therein (referred to herein as NVC).

It is possible for the adherent to comprise additives such as adherence-promoters, photoinitiators, or absorptive materials. The thickness of the post-cure adherent will vary depending on several factors, including the adherent used, the method of application, the amount of adherent applied, and force exerted on the adherent by the substrates. Different thicknesses will be desired for different applications. The level of cure needed is determined by the particular adherent used and by the force required to maintain a substrate or multilayer article in the position imparted by the holder or holders. For materials that are photocurable, heat curable, or chemically curable, it is possible for suitable cures to range from a few percent to 100%. For materials that undergo a complete phase transformation, e.g., liquid to solid, to attain the needed adherence, a complete phase transformation is considered to be a complete cure for the purposes of this application.

It is advantageous for the adherent to have, after the at least partial cure, a refractive index close to that of the substrate. Having a multilayer article with a near-uniform refractive index is advantageous because, as shown in the discussion of OPL above, a near-uniform refractive index through certain areas in an article will reduce the change in OPL in those areas. In other words, thickness variations in a substrate will not have a large effect on the ΔOPL if the adherent that fills or compensates for such variations has a refractive index close to the index of the substrate itself. For example, where two substrates each have a thickness variation of 5 waves/cm (i.e., total of 10 waves/cm), the refractive index is desirably within 1% (0.01) of the average of the refractive indices of the substrates in order to maintain a transmission flatness of 0.1 waves/cm. Where two substrates are used, the substrates advantageously have refractive indices that are equivalent to two decimal places, and the refractive index of the adherent is advantageously equivalent to two decimal places to the average of the refractive indices of the first and second substrates. In some applications, it is advantageous for the adherent to be of high optical quality, e.g., homogeneous, bubble-free, and low scattering.

The holders have a continuous surface portion on their inner surfaces to which the substrate or substrates substantially comply, as discussed above. The holders are advantageously vacuum chucks, meaning a flat surface in which the inner surfaces of the holders have one or more grooves, where a grasping force is created by application of a vacuum to the substrate through the groove or grooves. Alternatively, the grasping steps are performed by use of electrostatic or magnetic attraction, or by temporary chemical bonding (e.g., adhesive). The grasping or temporary bonding force holds the substrate against the inner surface of the holder, attaining substantial compliance, particularly over the continuous surface portion of the inner surface, as discussed above. The required force will vary depending on the parameters of the particular substrates used, e.g., composition, thickness, initial flatness, flexibility. In an embodiment using two holders, the holders are arranged in any way that allows the attainment of the selected angular relationship, such as the arrangement given in the embodiment above.

It is advantageous in a two-holder configuration for at least one holder to be attached to a mechanism that allows the holder to move along its z-axis with very little resistance during the curing step. (The x- and y-axes define the plane on which the adherent is disposed, and the z-axis is the remaining axis.) For example, the holder could be attached to a piston mechanism that equalizes the downward pressure caused by the weight of the holder and substrate, thereby allowing the holder to almost float along the z-axis while remaining fixed in pitch and yaw. Providing such a mechanism is advantageous because some adherents will contract during curing, and, if both holders were immovably fixed during the cure, it is possible for such contraction to detrimentally affect both the adhesion between the adherent and the substrates and the angular relationship between the holders.

It is possible for the holders to be made from any material that maintains a flat surface and is able to apply a grasping force to the substrates or adequately maintain a temporary chemical bond. In the case of a photocurable adherent, as discussed above, the holders are advantageously glass or another material that allows enough light transmission to obtain an adequate cure, and allows use of a Fizeau or similar method to confirm parallelism of the holders are advantageous. In the case of adherents that do not require light to cure, it is possible to use non-transparent materials, but other methods for confirming the angular relationship of such materials must be used. The material selected for the holder also depends on the type of grasping force or temporary bond utilized, e.g., adhesive bond or magnetic attraction, and on the intended use of the multilayer article or substrate being fabricated.

The substrates are of the same or different materials and are formed from ceramics (including glasses), metals, or plastics, depending on the intended use of the article or substrate being formed. Also, as discussed above in relation to the holders, it is possible for the substrates to be two pieces of a single part. The substrates are of any required shape. The substrates advantageously do not have flatness variations at such a high level that application of the grasping force could not attain substantial compliance with a holder surface without damaging the substrates. In addition to self-supporting substrates such as glass plates, it is possible for the substrates to be a polymeric material that is sprayed onto a holder, a thin polymer film such as Mylar Registered TM, or a polymer sheet such as polycarbonate. It is also possible for a polymeric material or film to be combined with a self-supporting material such as a glass plate to form a single substrate. The materials or films of such two-layer substrates may be photosensitive material, and the method of the invention is useful in improving the optical properties of such substrates.

It is important to design the Fizeau method to confirm parallelism and quality of the outer surfaces of the substrates. For example, it is advantageous to use plane wave illumination and wedged holders that are optically flat on both sides. In addition, antireflective (AR) coatings on substrates are advantageous for several reasons. Without an AR coating, no interface reflection exists between the substrate surface and the surface of the holder, making it difficult to utilize an interferometric method for determining the selected angular relationship. In addition, van der Waals and residual vacuum forces between the substrate and holder make separation of the substrate from the holder difficult, and antireflective coatings reduce such forces. Also, antireflective coatings enhance light throughput and reduce internal reflections within a multilayer substrate. Advantageously, only the side of the substrate that contacts the holder is given an AR coating. It is possible for AR coating on the side of a substrate on which the adherent is disposed to induce poor adhesion and/or cause unwanted additional reflections between the adherent and the substrate. In some configurations, however, other coatings, such as adhesion-promoters, are advantageously disposed on the side of the substrate on which the adherent is disposed. Such coatings are advantageously no thicker than 500 Angstroms.

The invention makes it possible to compensate for wedge type thickness variations, because the inner surfaces of the holders impart a selected angular relationship to the outer surfaces of the substrates, and wedge type variations in the substrates are translated to the interior of the article, where the adherent compensates for the variation while the angular relationship is maintained. The adherent similarly compensates for sharp or gradual wavy variations on the inner surfaces of the substrates by fg in such variations. It is possible to compensate for gradual, wavy variations on the side of the substrate on which no adherent has been disposed if (a) the method is performed such that at least some of the gradual wavy variations on the side of the substrate that complies with the holder are transmitted to the opposing side of the substrate, and (b) the adherent fills in or overlays the transmitted variations on that opposing side of the substrate. In addition, if the adherent in such a multilayer article has a post-cure refractive index close to the refractive index of the substrate, a near-uniform refractive index will be achieved in areas containing the adherent, and the change in optical path length across these areas of the article will therefore be reduced.

In addition to holographic memory cells, the method of the invention is useful for forming a variety of other types of articles, particularly for use in optical systems, including high quality mirrors, flats, windows, prisms, beam splitters, filters, and lenses.

EXPERIMENTAL RESULTS

A multilayer optical article was made using 3" square glass substrates. Two 10 cm diameter, about 1.9 cm thick glass flats having a surface flatness of 0.005 waves/cm were obtained, and into each was carved a circular vacuum-accessible groove about 3.2 mm wide by about 1.6 mm deep, the groove having an inner diameter of about 6.4 cm. The holders were cleaned by a drop and drag method using acetone and then methanol. The square glass substrates of display glass, having an antireflective coating on one side, measuring 75 mm by 75 mm by about 1.1 mm, and having surface flatness and transmission flatness values of about 1 wave/cm, were similarly cleaned. The holders were mounted into an apparatus such that they were located one over the other, and their vacuum grooves were attached to a house vacuum at approximately 0.1 atmosphere. The holders were arranged such that the bottom holder could be rotated in pitch and yaw, but did not move along the z-axis, whereas the top holder was fixed in pitch and yaw but moved vertically along the z-axis. To measure the parallelism of the holders, an expanded, collimated HeNe laser beam was directed at the central portion of the holders from above, at a slight angle. The reflection from the two inner surfaces of the holders when the holders were brought nearly into contact indicated the degree of parallelism of the holders. The bottom holder was adjusted until the interference reflection showed a bulls-eye pattern, which indicated a parallel relationship to within 0.05 waves/cm.

Once the parallelism was established, the top holder was moved up, the vacuum pump was started, and two of the substrates were placed onto the inner surfaces of the holders such that the side of the substrates having the antireflective coating contacted the holders. The force of the vacuum (approximately 0.1 atmosphere) caused substantial compliance of the substrates with the surface of the holders, primarily over the area surrounded by and including the vacuum grooves. About 0.4 mL of photopolymer used in holographic recording was introduced on the inner surface of the bottom substrate with a syringe and hypodermic needle until the photopolymer formed a small pool of liquid. (The amount of adherent liquid required to form a 65 mm diameter pool is approximately 1 mL per 250 µm of layer thickness.) The upper substrate was brought down into contact with the photopolymer, and the force between the substrates caused the adherent to spread across the inner surfaces of the substrates in a circular pattern.

The parallelism could be confirmed with the Fizeau method. The cell was illuminated from above with a uniform intensity visible flood lamp for approximately 90 seconds minutes to insure the curing of the photopolymer material. The area of the finished cell where the adherent contacted the substrates, which was within the continuous surface portion defined by the vacuum grooves of the holders, had rms surface and transmission flatness values of better than 0.16 waves/cm, a Strehl value of 0.96. These parameters were measured by a Zygo.RTM. Fizeau interferometer.

The vacuum on the top holder was then released and the third substrate was placed onto the inner surface of the top holder such that the side of the third substrate having the antireflective coating contacted the holder. The force of the vacuum (approximately 0.1 atmosphere) caused substantial compliance of the substrate with the surface of the holder, primarily over the area surrounded by and including the vacuum grooves. About 0.4 mL of photopolymer used in holographic recording was introduced on the exposed surface of the first fabricated cell with a syringe and hypodermic needle until the photopolymer formed a small pool of liquid. (The amount of adherent liquid required to form a 65 mm diameter pool is approximately 1 mL per 250 µm of layer thickness.) The upper substrate was brought down into contact with the photopolymer, and the force between the substrates caused the adherent to spread across the inner surfaces of the substrates in a circular pattern.

Figure 9:
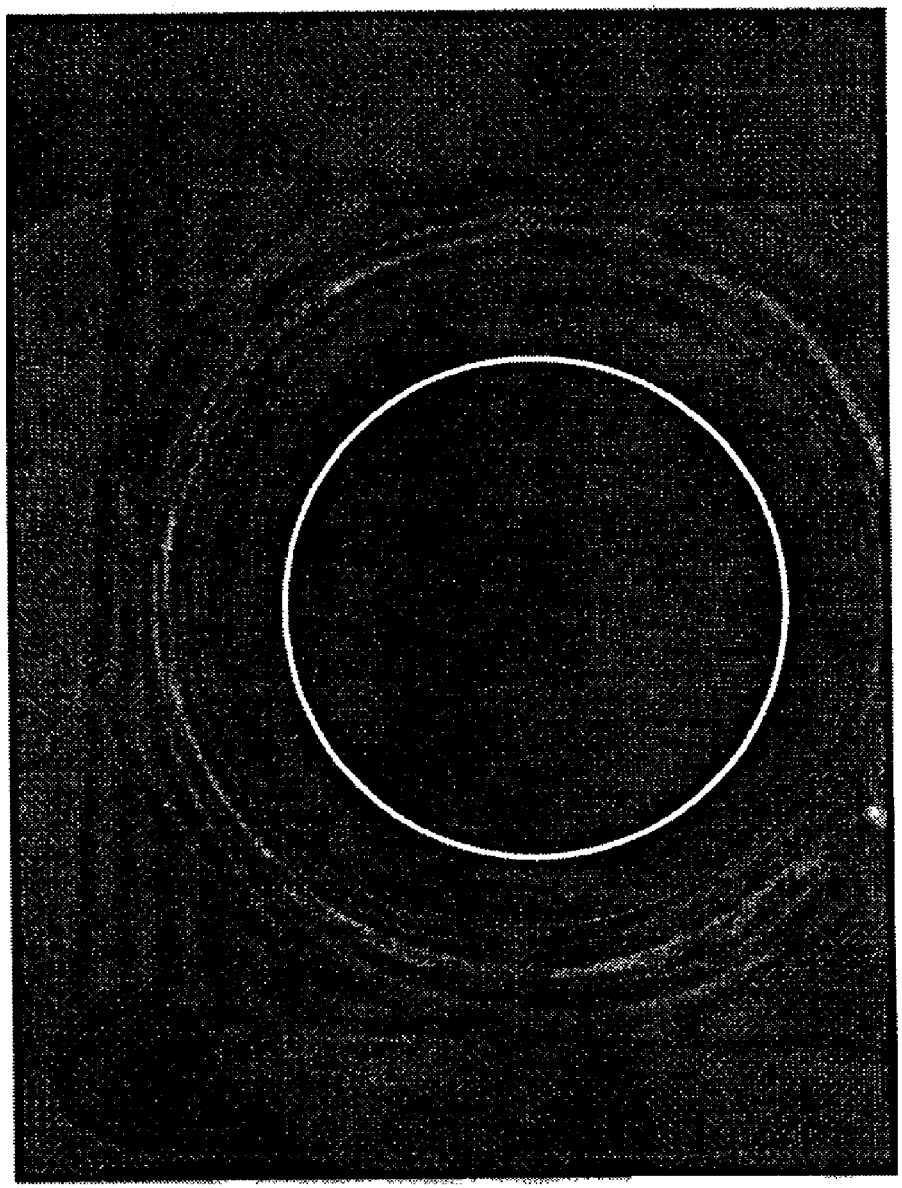
FIG. 9 shows an interferogram of a multilayer holographic memory cell of the present invention.

The parallelism could be confirmed with the Fizeau method. The cell was illuminated from above with a uniform intensity visible flood lamp for approximately 90 seconds minutes to insure the curing of the photopolymer material. The area of the finished cell where the adherent contacted the substrates, which was within the continuous surface portion defined by the vacuum grooves of the holders, had an rms surface and transmission flatness values of better than 0.16 waves/cm, a Strehl value of 0.9. These parameters were measured by a Zygo.RTM. Fizeau interferometer. The interferogram is shown in FIG. 9 where the white circle marks the boundary of the region through which the surface and transmission flatness and Strehl value were measured.

The invention claimed is:

1. A multilayer optical article comprising:
a first substrate;
a second substrate;
a third substrate;
a reflective layer disposed between the first substrate and the third substrate;
a first layer of partially cured adherent, wherein the first layer of partially cured adherent is disposed between a first surface of the first substrate and the second substrate; and
a second layer of partially cured adherent, wherein the second layer of partially cured adherent is disposed between a second surface of the first substrate and the third substrate, wherein the first and second adherent comprise a photopolymer such that the article is capable of storing data in a holographic data storage system, and wherein the multilayer optical article has a surface flatness of about 0.05 waves/cm to about 1 wave/cm at wavelengths of about 300 nanometers to 1600 nanometers, wherein a first layer bounded by a first surface of the first substrate and a first surface of the second substrate and a second layer bounded by a first surface of the first substrate and a first layer of the third substrate each have a transmission flatness of about 0.05 waves/cm to about 1 wave/cm at wavelengths of about 300 nanometers to 1600 nanometers.

2. The multilayer article of claim 1, wherein the substrates are made from glass, silicon, polycarbonate, polymethylmethacrylate, acrylic, polyolefin or any combination thereof.

3. The multilayer article of claim 1, wherein the substrates have at least one hole for dispensing an adherent through the substrate.

4. The multilayer article of claim 1, wherein the geometric form of the substrates may be square, rectangular, circular, or oval.

5. The multilayer article of claim 1, wherein the substrates are about 25 micrometers to about 3 millimeters in thickness.

6. The multilayer article of claim 1, wherein the outer surface of the first or second or third substrates contain surface relief patterns.

7. The multilayer article of claim 1, wherein one or both of the surfaces of the first or second or third substrate contain a surface relief pattern or a diffractive grating.

8. The multilayer article of claim 1, wherein the adherent is cured utilizing thermal or radiation energy.

9. The multilayer article of claim 1, wherein the article has a Strehl value of 0.9 or greater.

10. The multilayer article of claim 1, wherein the reflective layer is disposed adjacent the first surface or the second surface of the first substrate.

11. The multilayer article of claim 1, wherein the reflective layer includes at least one of aluminum, gold, and copper.

12. A multilayer reflective holographic storage system comprising:
a first substrate with a first and second surface, wherein the first surface is optically reflective
a second substrate;
a third substrate;
a first layer of partially cured adherent, wherein the first layer of partially cured adherent is disposed between the first surface of the first substrate and the second substrate; and a second layer of partially cured adherent, wherein the second layer of partially cured adherent is disposed between the second surface of the first substrate and the third substrate, wherein the first and second adherent comprise a photopolymer such that the article is capable of storing data in a reflective holographic data storage system, and wherein the multilayer storage system has a surface flatness of about 0.05 waves/cm to about 1 wave/cm at wavelengths of about 300 nanometers to 1600 nanometers, wherein a multilayer bounded by the first surface of the first substrate and the first surface of the second substrate and a multilayer bounded by the first surface of the first substrate and the first layer of the third substrate each have a transmission flatness of about 0.05 waves/cm to about 1 wave/cm at wavelengths of about 300 nanometers to 1600 nanometers.

13. The multilayer article of claim 12, wherein the substrates are made from glass, silicon, polycarbonate, polymethylmethacrylate, acrylic, polyolefin or any combination thereof.

14. The multilayer article of claim 12, wherein the substrates have at least one hole for dispensing an adherent through the substrate.

15. The multilayer article of claim 12, wherein the geometric form of the substrates may be square, rectangular, circular, or oval.

16. The multilayer article of claim 12, wherein the substrates are about 25 micrometers to about 3 millimeters in thickness.

17. The multilayer article of claim 12, wherein the outer surface of the first or second or third substrates contain surface relief patterns.

18. The multilayer article of claim 12, wherein the inner surface of the first or second or third substrate contain a surface relief pattern or a diffractive grating.

19. The multilayer article of claim 12, wherein the adherent is cured utilizing thermal or radiation energy.

20. The multilayer article of claim 12, wherein the article has a Strehl value of 0.9 or greater.

21. The multilayer article of claim 12, wherein the first surface of the first substrate includes a reflective layer.

22. The multilayer article of claim 21, wherein the reflective layer includes at least one of aluminum, gold, and copper.

* * * * *